(12) United States Patent
Coico et al.

(10) Patent No.: US 6,333,209 B1
(45) Date of Patent: Dec. 25, 2001

(54) ONE STEP METHOD FOR CURING AND JOINING BGA SOLDER BALLS

(75) Inventors: Patrick A. Coico, Fishkill; James H. Covell, Poughkeepsie; Lewis S. Goldmann, Bedford; Kimberly A. Kelly, Pleasant Valley, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/301,569

(22) Filed: Apr. 29, 1999

(51) Int. Cl.⁷ .................................................. H01L 21/48
(52) U.S. Cl. ........................ 438/108; 438/124; 438/126
(58) Field of Search ................................... 257/737, 738, 257/777, 778, 704; 438/108, 106, 612, 613, 118, 119, 121, 124, 126, 127; 29/841, 855, 840; 228/180.21, 180.22

(56) References Cited

U.S. PATENT DOCUMENTS

| | | | |
|---|---|---|---|
| 3,307,134 | 2/1967 | Griest | 338/237 |
| 3,810,068 | 5/1974 | DeLuca | 338/274 |
| 4,189,083 | 2/1980 | Johnson et al. | 228/123 |
| 5,471,027 | 11/1995 | Call et al. | 219/85.13 |
| 5,496,769 | 3/1996 | Marion et al. | 438/127 |
| 5,496,775 | 3/1996 | Brooks | 438/127 |
| 5,533,256 | 7/1996 | Call et al. | 29/840 |
| 5,634,268 | 6/1997 | Dalal et al. | 29/840 |
| 5,729,896 | 3/1998 | Dalal et al. | 29/840 |
| 5,930,598 * | 7/1999 | Willie et al. | 438/108 |
| 5,969,461 * | 10/1999 | Anderson et al. | 310/313 |
| 5,985,043 * | 11/1999 | Zhou et al. | 148/24 |
| 5,985,456 * | 11/1999 | Zhou et al. | 428/414 |
| 5,998,242 * | 12/1999 | Kirkpatrick et al. | 438/127 |
| 6,008,536 * | 12/1999 | Mertol | 257/704 |
| 6,059,894 * | 5/2000 | Pendse | 148/23 |
| 6,117,759 * | 9/2000 | Greer et al. | 438/616 |

FOREIGN PATENT DOCUMENTS

| | | |
|---|---|---|
| WO 98/48449 * | 10/1998 | (EP) . |
| WO 99/04430 * | 1/1999 | (EP) . |
| 63-293965 * | 11/1988 | (JP) . |
| 1-201931 * | 8/1989 | (JP) . |
| 2-2151 * | 1/1990 | (JP) . |
| 11-204573 * | 7/1999 | (JP) . |

* cited by examiner

*Primary Examiner*—Olik Chaudhuri
*Assistant Examiner*—Alonzo Chambliss
(74) *Attorney, Agent, or Firm*—H. Daniel Schnurmann; Cantor Colburn LLP

(57) ABSTRACT

A one step method for curing encapsulant and joining Ball Grid Array (BGA) solder balls comprises curing an encapsulant material simultaneously with the joining of the eutectic material of the apparatus whether that eutectic material is a solder paste or preform, the balls being of a higher melt material or the balls themselves being an eutectic material. The method performs both functions in one pass through a furnace avoiding the separate and time consuming encapsulant and/or underfill curing step.

14 Claims, 6 Drawing Sheets

FIGURE 1
FIRST PROCESS FLOW

A. CHIP JOIN
B. FLUX CLEAN
C. ELECTRICAL TEST (opt.)
D. DISPENSE UNDERFILL
E. CURE UNDERFILL/ENCAPSULANT
F. CAP ATTACH
G. BALL ATTACH:

| (CBGA) | (PBGA) |
|---|---|
| GC-1. EUTECTIC PREFORM APPLY | GP-1. EUTECTIC BALL APPLY |
| GC-2. EUTECTIC JOIN | GP-2. EUTECTIC JOIN |
| GC-3. FLUX CLEAN | |
| GC-4. PLACE HIGH MELT BALL | |
| GC-5. BALL JOIN | |
| GC-6. FLUX CLEAN | GP-3. FLUX CLEAN |

H. FINAL TEST

FIGURE 2
SECOND PROCESS FLOW

A. CHIP JOIN
B. FLUX CLEAN
C. ELECTRICAL TEST (opt.)
D. DISPENSE UNDERFILL
G. BALL ATTACH:

| (CBGA) | (PBGA) |
|---|---|
| GC-1. EUTECTIC PREFORM APPLY | GP-1. EUTECTIC BALL APPLY |
| GC-2. EUTECTIC JOIN / GC-2&E UNDERFILL/ENCAPSULANT CURE | GP-2. EUTECTIC JOIN / GP-2&E UNDERFILL/ENCAPSULANT CURE |
| GC-3. FLUX CLEAN | |
| GC-4. PLACE HIGH MELT BALL | |
| GC-5. BALL JOIN | |
| GC-6. FLUX CLEAN | GP-3. FLUX CLEAN |

F. CAP ATTACH
H. FINAL TEST

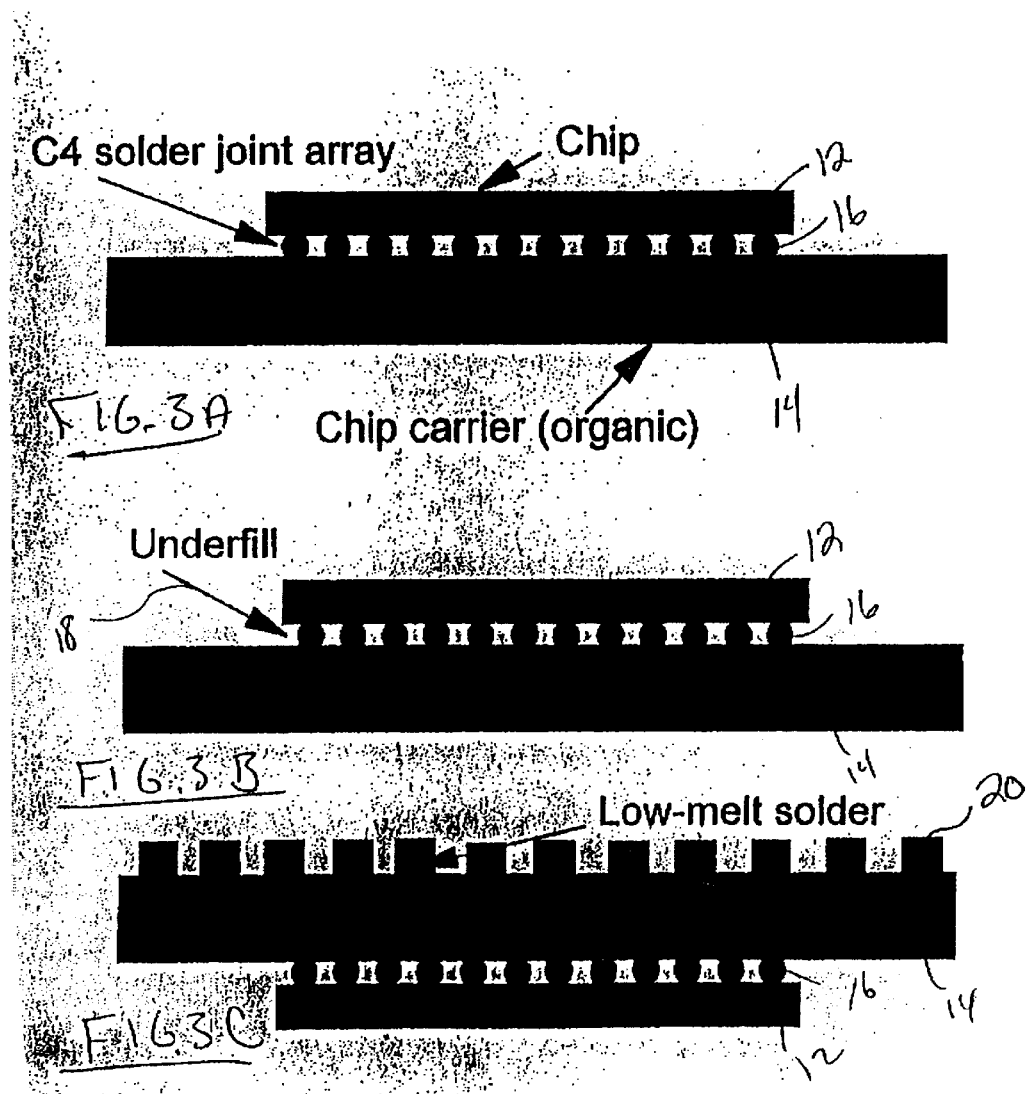

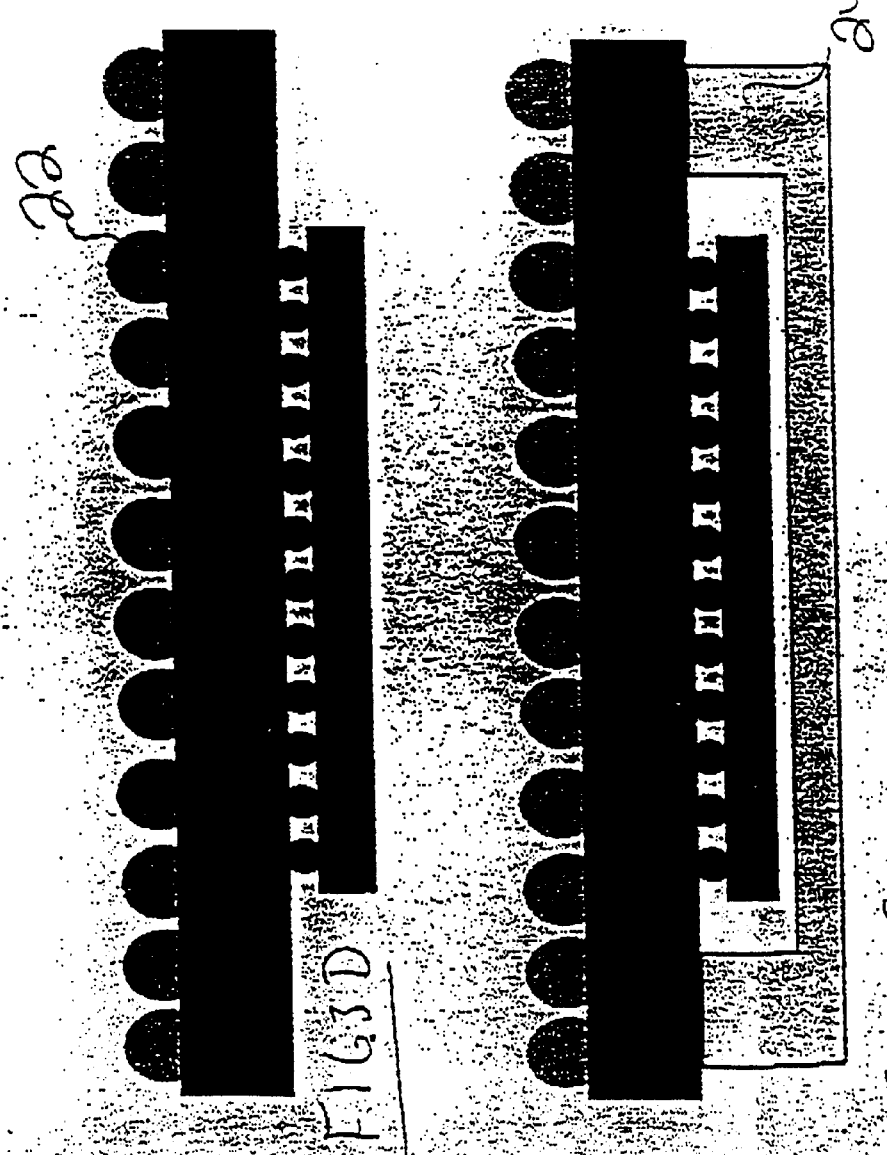

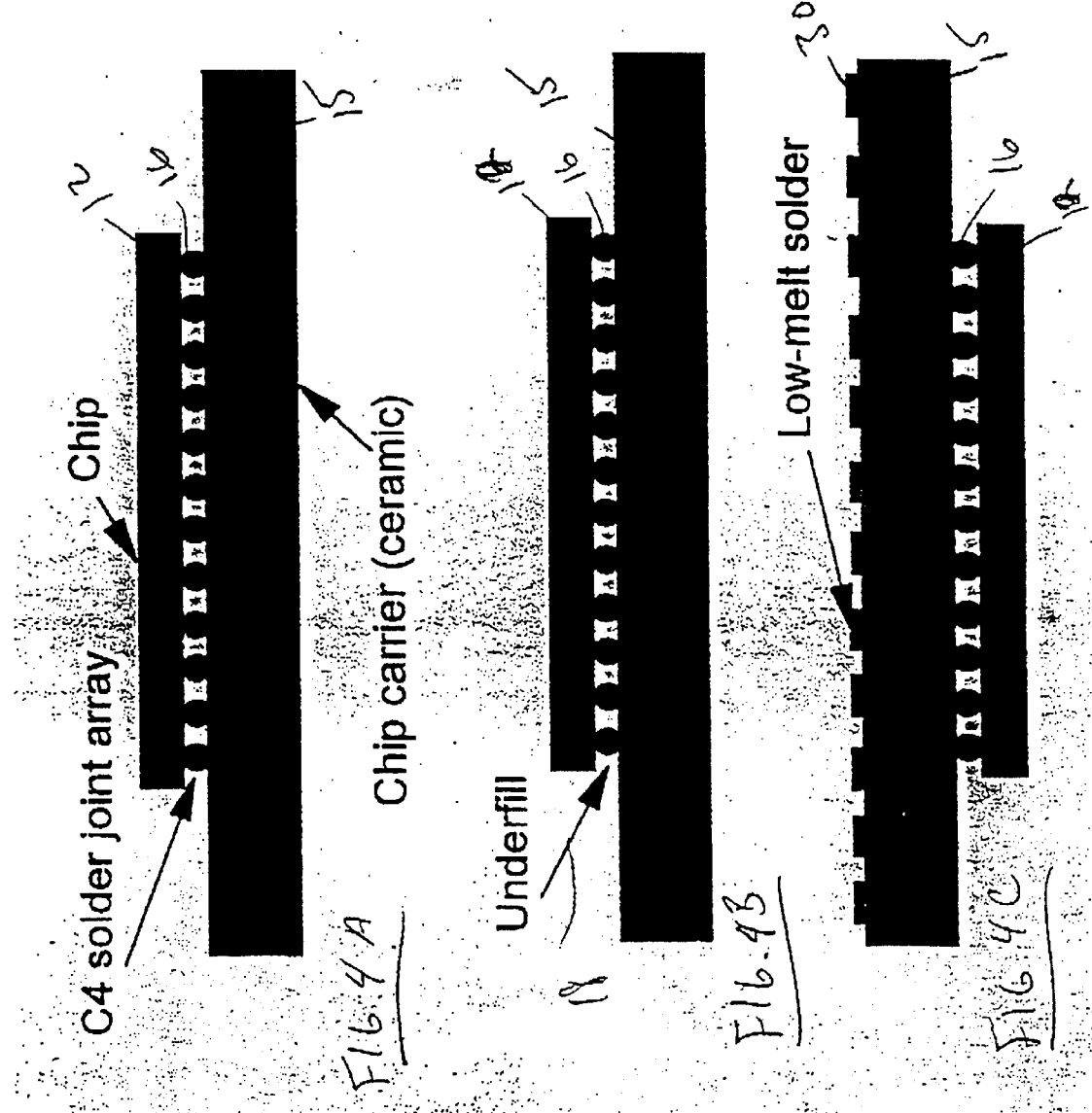

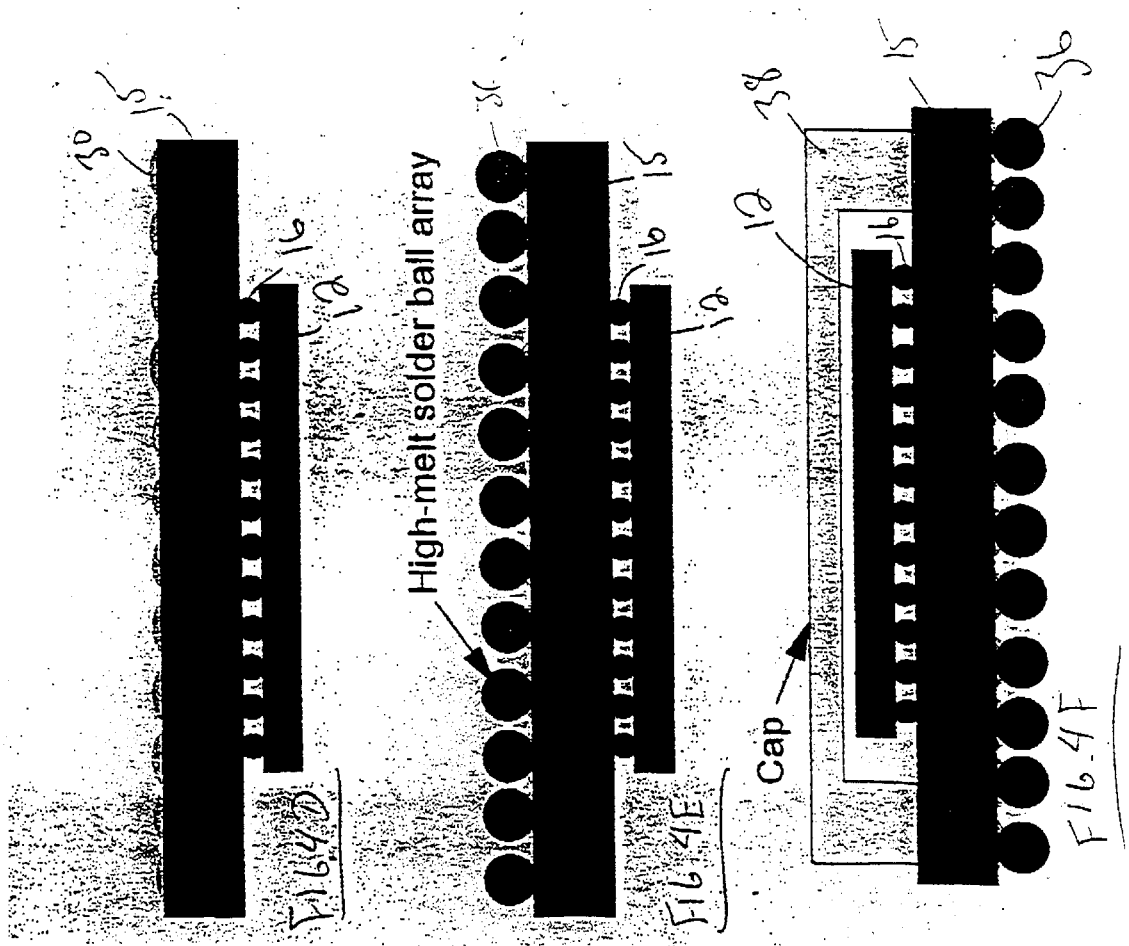

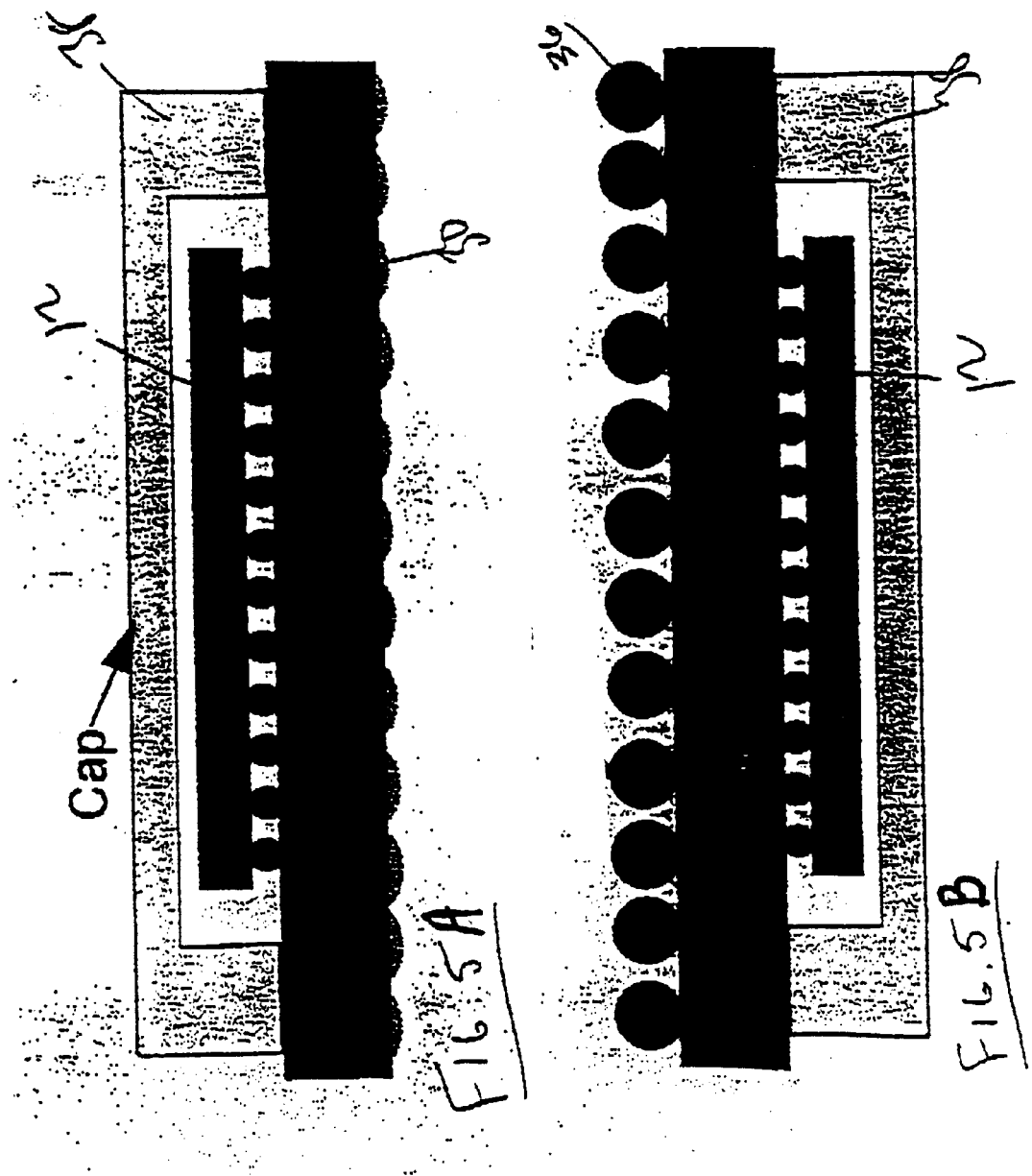

ONE STEP METHOD FOR CURING AND JOINING BGA SOLDER BALLS

FIELD OF THE INVENTION

The present invention relates to an improved method for producing a chip carrier, which method realizes a savings in time and expense. More particularly, the invention reduces the number of processing steps required to produce a chip carrier (i.e. a batch of carriers) by causing the curing of the encapsulant and/or underfill material to occur simultaneously with the joining of material to the carrier substrate.

BACKGROUND OF THE INVENTION

The semiconductor device field is highly competitive relative to improvements in chip and carrier performance and to costs associated with their production. Methods for producing such chip carriers which reduced cost are thus constantly sought.

Ball Grid Arrays (BGA's) have become, in recent years, one of the dominant surface mount technologies for electrically interconnecting electronic chip carriers to circuit boards. In a BGA, an areal array of solder balls is attached to the underside of the chip carrier (or substrate) to allow subsequent high density, low impedance interconnection of the substrate to a circuit card.

Although there are several distinct classes of BGA interconnection configurations, two of the prior art classes are directly relevant to the invention. Thus, these two are discussed herein.

A first class of BGA is that which is intended to be used with an organic substrate chip carrier. Organic substrates are tolerant only of lower elevated temperature ranges. Typically with organic substrates the balls are made of a low melt solder such as eutectic lead-tin alloy. Eutectic balls are directly attached to the substrate metalization by reflow of the balls themselves in a reflow furnace. The art commonly refers to such ball arrays as a Plastic Ball Grid Array (PBGA) package.

The second prior art class of BGA is intended for use with a ceramic chip carrier (CBGA) package. In ceramic substrate packages, typically higher temperature melt balls are employed which then are secured to the substrate using a preform or paste. The preform or paste is reflown in a reflow furnace similar to the PBGA balls. In the CBGA package however, the balls themselves do not melt.

In both of these BGA packages an issue that must be considered by the manufacturer and satisfactorily remedied is the attachment of the chip to the carrier or substrate. The reason the attachment is an issue is that there is a thermal mismatch resulting in strain between the chip and the substrate. As one of skill in the art will appreciate, thermal cycling is a repeated process during the life of the product and if unchecked can shorten the life thereof. To help increase the service life of these products, an underfill or encapsulation material has been introduced under the chip around the surrounding joints. The underfill material preferably has properties tailored to absorb strain. Typical materials employed for this purpose are epoxies filled with silica. These types of compositions, while being quite effective for their intended purpose, take significant amounts of time to cure. In fact, cure times can be several hours long. In addition, the curing is undertaken at relatively high temperature. Thus, the processes currently used for preparing packages is expensive both from the standpoint of relatively slow production (time delay for curing) and the cost of providing elevated temperature for a long period of time relative to the number of products produced.

More recently, advances in epoxy resins have developed encapsulation/underfill material with cure rates that are much less time consuming than the earlier encapsulation/underfill materials. Such epoxies cure at temperatures of between about 150° C. to about 230° C. in between about 15 to about 30 minutes. Hysol 4526 is one such composition and is commercially available from Dexter Electronics, Industry California.

Even with faster curing epoxies such as the one identified, time is still lost due to a delay for curing in present processing and the art is in need of a less time consuming processing arrangement.

PURPOSES AND SUMMARY OF THE INVENTION

The invention is a novel method for manufacturing an electronic chip carrier package.

Accordingly it is a purpose of the invention to build a reliable chip carrier.

It is another purpose of the invention to reduce processing time while maintaining quality of the chip carrier package.

Therefore, in one aspect, this invention comprises building an electronic chip carrier by electronically attaching a chip to a substrate and underfilling an area between said chip and said substrate with an encapsulant material. Curing of said encapsulant and/or underfill material is undertaken simultaneously with the reflowing of a conductor material of a eutectic or other low melt material preferably having a melting point of less than 220° C. The reflowing operation functions to electrically connect electrical elements to said substrate. By combining steps and employing fast curing silicon filled epoxies this invention greatly benefits the art.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

FIG. 1 is a process flow of a prior art process illustrating both PBGA and CBGA constructions;

FIG. 2 is a process flow of the invention also illustrating both PBGA and CBGA constructions;

FIGS. 3A–3E are sequential schematic views of a PBGA chip carrier in various stages of construction;

FIGS. 4A–4F are sequential schematic views illustrating one processing embodiment for a CBGA chip carrier; and FIGS. 5A–5B are sequential schematic views illustrating a second processing embodiment for a CBGA chip carrier.

DETAILED DESCRIPTION OF THE INVENTION

The invention enhances profitability in the manufacture of chip carriers by reducing the cost of producing the same. Costs are reduced by reducing total processing time and therefore reducing the energy required and manpower or machine power required to complete the job.

The inventors of the present invention have developed a process by which a number of independent steps have been combined in a single operation in the invention. Furthermore, it should be understood that this invention is applicable to both underfill and/or encapsulant processes, and as such these terms may be used interchangeably to illustrate the inventive concept. Referring to FIGS. 1 and 2 simultaneously, one of skill in the art will appreciate that the invention avoids step E in the first process and rather combines the function of step E with a joining step in the second process. More specifically, the first process of FIG. 1 includes step E which has the function of curing the underfill material. As has been noted hereinbefore and as is appreciated by one of skill in the art, the curing step requires the application of elevated temperature to the composition in the range of about 150° C. to about 230° C. for an extended period of time. With older silica filled epoxy materials the period of time would generally extend for hours. With newer underfill materials the period has been shortened to less than an hour but still requires some time to cure during which time no other processes are undertaken and a "bottle neck" is created. In the first process, the chip is joined to the substrate material (A) and the unit is flux cleaned (B). Electrical testing (C) may then be conducted if desired prior to continuing assembly of the carrier. Underfill material is applied between the chip and the substrate (D) and it is then cured (E). After the curing step, the cap is attached (see step F). Preferably by employing a silicone elastomer to adhere the cap to the substrate and enclose the chip. The ball attach process is then begun. The particular process used is dependent upon the type of substrate material i.e. organic (PBGA) or ceramic (CBGA). The processes themselves are discussed further hereunder.

In FIG. 1 (and in FIG. 2 for clarity) the process steps are alphanumerically tagged with the first letter "G" corresponding to the ball attach step (G) and the second letter "C" or "P" indicating ceramic or plastic BGA types. The numbers, of course, are merely to distinguish the individual steps.

The individual steps of Ball Attach are easily recognizable to one of ordinary skill in the art. The invention is further concerned with the steps labeled GC-2 and GP-2. In the first process (FIG. 1) these steps are solely for solder join whether that be a reflowing of the Balls themselves (PBGA and organic substrate) or a reflowing of a solder preform or paste with high melt balls (CBGA and ceramic substrate). In the invention on the other hand, steps GC-2 and GP-2 include simultaneous conductor material joining and underfill curing. The reader will also note that the letter "E" in FIG. 2 has been moved in the process. Because E has been moved to coincide temporally with reflow of the joining material (i.e. made a part of GC-2&E or GP-2&E) a significant savings in time for completion of the construction of the chip carrier has been realized.

Pictorially, the invention is illustrated in FIGS. 3A–3E, 4A–4F and 5A–5B. Referring to FIGS. 3A–3E (a PBGA carrier) first a chip 12 is mounted on an organic substrate or chip carrier 14 by a plurality of solder balls 16. This image relates to letters A–C in FIGS. 1 and 2.

FIG. 3B indicates the location of the underfill material by arrow 18 and corresponds to letter D in FIGS. 1 and 2. Steps E and F of FIG. 1 are displaced.

In FIG. 3C the device has been inverted and a solder material 20 is applied which will become the BGA upon reflow. This relates to GP-1 in FIGS. 1 and 2. FIG. 3D illustrates the conductive material balls reflowed to become the PBGA 22 and corresponds to letters GP-2 wherein it will also be understood that the underfill material 18 is cured. Thus, the step of E of the first process is combined with the step GP-2 in the second process.

FIG. 3E illustrates the completed carrier with the cap 24 having been attached in a conventional way.

Referring now to FIGS. 4A–4F a CBGA package is pictorially illustrated and related to the process of FIG. 2. Ceramic substrate 15 is distinct from the organic substrate 14 and thus is assigned a different numeral. Chip 12 and balls 16 however are identical to the previous F embodiment and the figure relates to letters A–C.

FIG. 4B illustrates the underfill location by arrow 18 and relates to letter D in the process flow of FIGS. 1 and 2. As in the FIG. 3 series, the FIG. 4 series now departs from the process flow of FIG. 1 and follows only FIG. 2.

FIG. 4C shows the application of a preform or paste 30 to substrate 15 which corresponds to GC-1.

FIG. 4D illustrates the condition of the preform 30 after reflow during which the underfill is cured. This corresponds to steps GC-2 and GC-3.

FIG. 4E places the high melt balls 36 of the CBGA, joins the balls and cleans corresponding to GC-4–GC-6.

FIG. 4F is an illustration of the cap 38 attachment of step F in FIG. 2. Caps are generally attached with a silicone elastomer such as Dow Corning's Sylgard™577. The material cures at a range of temperature related to the speed of cure. The cure temperature favored for the present invention is about 150° C. The silicone elastomer material is placed, as will be recognized by one of ordinary skill in the art, either on the substrate or on the cap. Pressure is then applied to join the substrate to the cap. In the FIG. 4 embodiment, the cap 38 is attached after the encapsulant/underfill cure. This procedure is preferred where the particular fill material is subject to off-gassing during curing. If the cap were placed first, the gasses would be trapped and could damage the product. Where off-gassing during curing is not an issue however, the process of FIGS. 5A and 5B may be preferred.

Referring to FIGS. 5A and 5B, it should be noted that the initial process of the embodiment is the same as already identified in FIGS. 4A–4D and therefore it will not be separately discussed. FIGS. 5A and 5B illustrate the process where the cap 38 is attached to the substrate prior to the BGA attachment. This sequence of events leads to a well protected chip during the fixturing commonly used for the high melt ball (36) attachment. It will be appreciated by one of skill in the art that silicone chips are extremely fragile and can be damaged in the fixturing process when not protected. Thus where the encapsulant/underfill material does not detrimentally off-gas during curing, this embodiment may be preferred.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A method for building an electronic chip carrier comprising the steps of:

electronically attaching at least one chip to a first side of a substrate with at least one first conductive material;

filling an area between said chip and said first side of the substrate with at least one encapsulant underfill material;

depositing at least one second conductor material on an underside of said substrate; and heating at a temperature to effect curing said underfill material between said chip and said first side of said substrate simultaneously with said at least one second conductor material on the underside of said substrate, but at a temperature below the reflowing temperature of said at least one first conductive material.

2. The method as in claim 1 wherein said at least one conductor material is in the form of a ball grid array and said reflowing is a reflowing of the ball grid array to attach said array to said substrate.

3. The method as in claim 1 wherein said at least one conductor material is in the form of one of a preform and a paste and said reflowing is a reflowing of said one of said preform and said paste to attach a ball grid array to said substrate, wherein said ball grid array melts at a temperature higher than the temperature to effect said reflowing.

4. The method as in claim 1 wherein said curing and said reflowing comprises:

heating said at least one encapsulant underfill material and said at least one conductor material to a temperature in the range of between about 150° C. to about 230° C. for a period of time to cure said at least one encapsulant underfill material and reflow said at least one conductor material.

5. The method as in claim 4 wherein said period of time is between about 15 minutes to about 30 minutes.

6. A method for building an electronic chip carrier comprising the steps of:

electrically attaching at least one chip to a first side of a substrate with at least one first conductive material to provide a first subassembly;

filling a space between said chip and said first side of the substrate with at least one encapsulant underfill material;

electrically attaching a plurality of conductive balls to an underside of said substrate while simultaneously curing said at least one encapsulant underfill material to provide a second subassembly by heating at a temperature sufficient to effect curing said underfill material and reflowing of the conductive balls but at a temperature below the reflowing temperature of the at least one first conductive material; and attaching a cap to said second subassembly over said at least one chip.

7. The method as in claim 6 wherein said filling comprises applying at least one epoxy encapsulant material between said at least one chip and said substrate.

8. The method as in claim 6 wherein said electrically attaching comprises reflowing a conductive material.

9. The method as in claim 6 wherein said method further comprises at least one heating cycle.

10. The method as in claim 9 wherein said at least one heating cycle electrically attaches electrical elements and cures said at least one encapsulant underfill material.

11. The method as in claim 10 wherein said at least one heating cycle is in the range of between about 15 minutes to about 30 minutes.

12. The method as in claim 10 wherein said at least one heating cycle comprises heating said first subassembly and said second subassembly to in the range of between about 150° C. to about 230° C.

13. The method as in claim 10 wherein said at least one heating cycle is a plurality of heating cycles.

14. The method as in claim 6 wherein said attaching a plurality of conductive balls includes placing said plurality of conductive balls on the underside of a ceramic substrate.

* * * * *